(12) United States Patent
Heimgartner et al.

(10) Patent No.: US 10,741,613 B2
(45) Date of Patent: Aug. 11, 2020

(54) OPTICAL ELEMENT STACK ASSEMBLIES

(71) Applicant: ams Sensors Singapore Pte. Ltd., Singapore (SG)

(72) Inventors: Stephan Heimgartner, Passugg (CH); Alexander Bietsch, Thalwil (CH); Peter Riel, Bach (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/516,692

(22) PCT Filed: Oct. 14, 2015

(86) PCT No.: PCT/SG2015/050387
§ 371 (c)(1),
(2) Date: Apr. 4, 2017

(87) PCT Pub. No.: WO2016/060615
PCT Pub. Date: Apr. 21, 2016

(65) Prior Publication Data
US 2017/0309685 A1    Oct. 26, 2017

Related U.S. Application Data

(60) Provisional application No. 62/063,532, filed on Oct. 14, 2014.

(51) Int. Cl.
*H01L 27/32* (2006.01)
*H01L 31/0232* (2014.01)
(Continued)

(52) U.S. Cl.
CPC .......... *H01L 27/3209* (2013.01); *B32B 33/00* (2013.01); *B32B 37/02* (2013.01);
(Continued)

(58) Field of Classification Search
CPC ................ B32B 37/02; B32B 37/1292; B32B 2037/243; B32B 2307/412;
(Continued)

(56) References Cited

U.S. PATENT DOCUMENTS 6,235,141 B1 * 5/2001 Feldman ............. G02B 6/4206
156/250
6,381,072 B1    4/2002 Burger
(Continued)

FOREIGN PATENT DOCUMENTS

JP    2003330006 A    11/2003
JP    2007279222 A    10/2007
(Continued)

OTHER PUBLICATIONS

Song, "Vacuum Assisted Resin Transfer Molding (VARTM): Model Development and Verification," 2003, pp. 1-4.*
(Continued)

*Primary Examiner* — Savitri Mulpuri
(74) *Attorney, Agent, or Firm* — Michael Best and Friedrich LLP

(57) ABSTRACT

The present disclosure describes optical element stack assemblies that include multiple substrates stacked one over another. At least one of the substrates includes an optical element, such as a DOE, on its surface. The stack assemblies can be fabricated, for example, in wafer-level processes.

3 Claims, 6 Drawing Sheets

(51) Int. Cl.
*G02B 5/18* (2006.01)
*B32B 33/00* (2006.01)
*B32B 37/02* (2006.01)
*H01L 23/00* (2006.01)
*B32B 37/12* (2006.01)
*G02B 27/09* (2006.01)
*G02B 27/42* (2006.01)
*H01S 5/00* (2006.01)
*B32B 37/24* (2006.01)
*G02B 3/00* (2006.01)

(52) U.S. Cl.
CPC ........ *B32B 37/1292* (2013.01); *G02B 5/1847* (2013.01); *G02B 5/1866* (2013.01); *G02B 27/0944* (2013.01); *G02B 27/0977* (2013.01); *G02B 27/4205* (2013.01); *H01L 24/94* (2013.01); *H01L 31/0232* (2013.01); *B32B 2037/243* (2013.01); *B32B 2307/412* (2013.01); *B32B 2307/418* (2013.01); *B32B 2551/00* (2013.01); *G02B 3/0012* (2013.01); *G02B 2207/00* (2013.01); *H01L 2227/32* (2013.01); *H01L 2924/12041* (2013.01); *H01L 2924/12044* (2013.01); *H01S 5/005* (2013.01)

(58) Field of Classification Search
CPC .......... B32B 2307/418; B32B 2551/00; G02B 27/0944; G02B 27/0977; G02B 27/4205; G02B 5/1847; G02B 5/1866; G02B 2207/00; G02B 3/0012; H01L 27/3209; H01L 31/0232; H01L 24/94; H01L 2227/32; H01S 5/005
See application file for complete search history.

(56) References Cited

U.S. PATENT DOCUMENTS

| | | | | |
|---|---|---|---|---|
| 6,509,085 | B1* | 1/2003 | Kennedy | B01L 3/502707 156/277 |
| 6,669,803 | B1* | 12/2003 | Kathman | G02B 6/12 156/250 |
| 6,770,503 | B1* | 8/2004 | Marinis | B81B 7/0077 257/444 |
| 7,300,812 | B2* | 11/2007 | Chen | B81B 7/007 438/113 |
| 7,482,193 | B2* | 1/2009 | DCamp | B81B 7/0038 438/112 |
| 8,000,041 | B1 | 8/2011 | Lin et al. | |
| 8,547,470 | B2* | 10/2013 | Yano | B29D 11/00432 348/335 |
| 8,570,669 | B2* | 10/2013 | Oganesian | H01L 27/14618 216/24 |
| 9,094,593 | B2* | 7/2015 | Rudmann | H04N 5/2252 |
| 10,153,179 | B2* | 12/2018 | Lin | H01L 21/56 |
| 10,153,204 | B2* | 12/2018 | McKenzie | H01L 27/14649 |
| 2009/0305451 | A1* | 12/2009 | Hsuan | H01L 27/14618 438/65 |
| 2009/0321861 | A1* | 12/2009 | Oliver | H01L 27/14618 257/432 |
| 2010/0073534 | A1 | 3/2010 | Yano et al. | |
| 2010/0208354 | A1 | 8/2010 | Okazaki et al. | |
| 2011/0221950 | A1* | 9/2011 | Oostra | H04N 5/2254 348/335 |
| 2011/0273600 | A1* | 11/2011 | Kriman | H01L 27/14618 348/294 |
| 2013/0019461 | A1 | 1/2013 | Rudmann et al. | |
| 2013/0037054 | A1 | 2/2013 | Saruya | |
| 2013/0048208 | A1 | 2/2013 | Lin et al. | |
| 2013/0188267 | A1 | 7/2013 | Oganeisan | |
| 2013/0267273 | A1 | 10/2013 | Rudmann et al. | |
| 2018/0329175 | A1* | 11/2018 | Wang | B29C 39/10 |

FOREIGN PATENT DOCUMENTS

| | | |
|---|---|---|
| JP | 2007294336 A | 11/2007 |
| JP | 2009067056 A | 4/2009 |
| JP | 2009301061 A | 12/2009 |
| JP | 2014089230 A | 5/2014 |
| TW | I435134 | 4/2012 |
| TW | 201310106 A | 3/2013 |
| WO | 2008/063528 A | 5/2008 |
| WO | 2011/055655 | 5/2011 |
| WO | 2013/026175 | 2/2013 |

OTHER PUBLICATIONS

International Search Report and Written Opinion issued by ISA/AU for PCT/SG2015/050387 (dated Nov. 26, 2015).
Supplementary European Search Report issued in European Application No. 15850175.9, dated Mar. 16, 2018, 6 pages.
Japanese Patent Office Action for Application No. 2017-519894 dated Dec. 3, 2019 (3 pages).

* cited by examiner

OPTICAL ELEMENT STACK ASSEMBLIES

CROSS-REFERENCE TO RELATED APPLICATION(S)

The present application claims the benefit of priority of U.S. Provisional Patent Application No. 62/063,532, filed on Oct. 14, 2014. The disclosure of the earlier application is incorporated herein by reference in its entirety.

FIELD OF THE DISCLOSURE

The present disclosure relates to optical element stack assemblies.

BACKGROUND

Various optoelectronics modules are used, for example, for imaging applications, such as three-dimensional (3D) imaging, or distance measurement applications, such as proximity sensing. In some applications, an optical emitter assembly is operable to emit a structured optical pattern, which can be useful for imaging as well as distance sensing applications. The structured light can result in a pattern of discrete features (i.e., texture) being projected onto an object. Light reflected by the object can be directed back toward an image sensor, where it is sensed. The sensed signals can be used for distance calculations. In some cases, structured light provides additional texture for matching pixels in stereo imaging applications.

In some modules, an optical element, such as a diffractive optical element (DOE), is introduced into the path of light emitted by a light source such as a vertical cavity semiconductor emitting laser (VCSEL) or VCSEL array. The DOE can be useful in creating the structured light pattern. It also can facilitate multiplying a structured light pattern generated by the VCSEL or other light source.

SUMMARY

The present disclosure describes optical element stack assemblies that can be fabricated, for example, by wafer-level methods.

For example, in one aspect, a wafer-level method of fabricating stack assemblies includes attaching a first wafer to a second wafer to form a wafer sub-stack. At least one of the first wafer or the second wafer has optical elements on its surface. The first and second wafers are attached such that each optical element is disposed between the first and second wafers. The method further includes attaching a spacer wafer to the wafer sub-stack to form a wafer stack, and separating the wafer stack into stack assemblies, each of which includes at least one of the optical elements.

In another aspect, a wafer-level method of fabricating stack assemblies includes providing first and second wafers, wherein at least one of the first wafer or the second wafer has optical elements on its surface. The method includes using a single vacuum injection technique to form upper and lower spacers on opposite surfaces of the second wafer. The method further includes attaching the first wafer to the second wafer to form a wafer stack. The first and second wafers can be attached such that each optical element is disposed between the first and second wafers. The wafer stack then can be separated onto stack assemblies, each of which includes at least one of the optical elements.

In yet another aspect, a wafer-level method of fabricating stack assemblies includes providing first and second wafers, wherein at least one of the first wafer or the second wafer has optical elements on its surface. The method includes attaching the second wafer to a tape and separating the second wafer into singulated substrates. The singulated substrates are placed into a vacuum injection tool to form upper and lower spacers on opposite surfaces of the singulated substrates. The first wafer is attached to the singulated substrates to form a stack such that each optical element is disposed between the first wafer and one of the singulated substrates. The stack then is separated into stack assemblies, each of which includes at least one of the optical elements.

The disclosure also describes a stack assembly including a first substrate, a second substrate attached to the first substrate, and an optical element on at least the first substrate or the second substrate, wherein the at least one optical element is disposed between the first and second substrates. The stack assembly includes a first spacer attached to an outer side of the first or second substrate. In some implementations, the stack assembly further includes a second spacer between the first and second substrates, wherein the first and second spacers are part of the same vacuum injection molded piece. Also, in some cases, the vacuum injection molded piece laterally surrounds side edges of the second substrate. Further, the first and second substrates can be attached to one another by adhesive on a lateral side portion of one or more of the optical elements.

Various implementations include one or more of the following features. For example, each of the first and second wafers can have a respective optical element on its surface, the optical elements facing one another. In some instances, the optical elements are diffractive optical elements. In some implementations, the optical elements are replicated optical elements.

The wafer-level methods allow multiple assemblies to be fabricated in parallel at the same time. Further, the techniques can be used advantageously to provide for smaller or larger distances between the first and second wafers, depending on the application. Various examples are described in greater detail below. Other aspects, features and advantages will be readily apparent from the following detailed description, the accompanying drawings and the claims.

DETAILED DESCRIPTION

The present disclosure describes optical element stack assemblies that include multiple substrates stacked one over another. At least one of the substrates includes an optical element, such as a DOE, on its surface. In some cases, both substrates have an optical element on their respective surfaces. The substrates, and optical elements, are aligned such that an optical signal passing through the stack passes through the substrates and the optical element(s).

Figure 1:
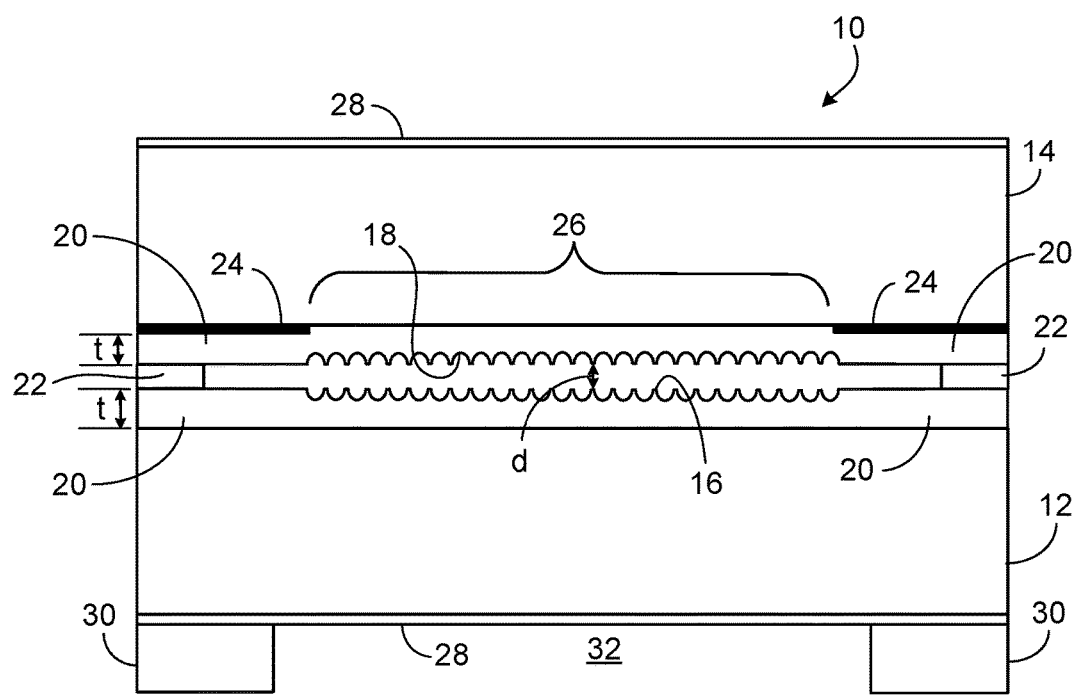
FIG. 1 illustrates a first example of an optical element stack assembly.

As shown in FIG. 1, a stack assembly 10 includes first and second substrates 12, 14 stacked one over the other. Each substrate 12, 14 can be composed, for example of a glass, polymer or other material that is transparent to a specified wavelength or range of wavelengths (e.g., in the visible, infra-red (IR) and/or near-IR parts of the spectrum). In the example of FIG. 1, the substrates 12, 14 have passive optical elements 16, 18 formed on their opposing surfaces. In the illustrated example, the optical elements 16, 18 are DOEs. Other types of passive optical elements (e.g., refractive or diffractive lenses, or arrays of optical elements, such as micro-lens arrays) can be provided in some implementations. Further, in some cases, one substrate 12 may have a type of optical element that differs from the type of optical element on the other substrate 14. In some instances, only one of the substrates 12, 14 may have an optical element on its surface.

The lateral side portions 20 of the material forming the optical elements 16, 18 can serve as spacers to provide a well-defined separation 'd' between the opposing optical elements 16, 18. A typical thickness 't' of the lateral side portions 20 is 50 µm or less (e.g., 25-50 µm). In the illustrated example, the optical elements 16, 18 are composed of an epoxy material that is transparent to the specified wavelength or range of wavelengths. The substrates 12, 14 are connected together by a thin layer of glue or other adhesive 22 disposed on the lateral portions 20. A typical thickness of the adhesive 22 is less than 10 µm (e.g., 7 µm). The dimensions mentioned above may differ in some implementations.

A thin non-transparent coating 24 on the optical-element side of the top substrate 14 defines an optical stop 26, which serves to define a transparent window through which light of the specified wavelength or in the specified range of wavelengths can pass. An outer surface of each substrate 12, 14 can be coated with a thin anti-reflective coating (ARC) 28. The ARC-side of the bottom substrate 12 includes a spacer 30 to provide a well-defined distance between the optical elements 16, 18 and a surface on which the assembly 10 is mounted. The spacer 30, which can be fixed to the ARC-side of the bottom substrate 12 by adhesive, has an opening 32 below the stop 26.

FIGS. 2A-2F illustrate steps of a wafer-level method for manufacturing optical element stack assemblies such as the assembly 10 of FIG. 1. Wafer-level processes allow multiple assemblies 10 to be fabricated at the same time. Generally, a wafer refers to a substantially disk- or plate-like shaped item, its extension in one direction (z-direction or vertical direction) is small with respect to its extension in the other two directions (x- and y- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer-level process, there can be provisions for at least ten modules in each lateral direction, and in some cases at least thirty or even fifty or more modules in each lateral direction. To facilitate understanding, in FIGS. 2A-2F only a portion of each wafer corresponding to a single assembly 10 is illustrated.

Figure 2A:
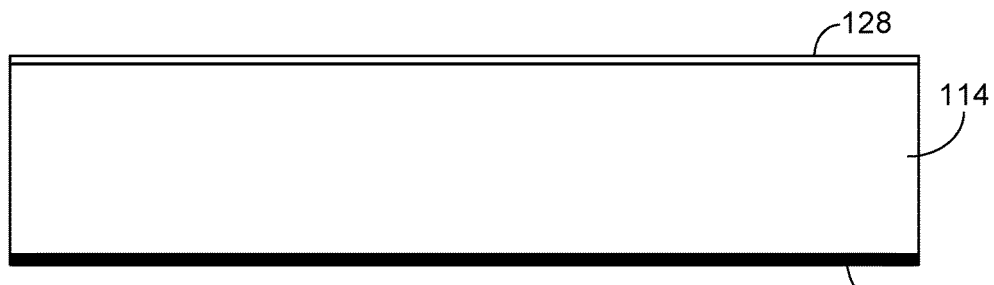
FIGS. 2A-2F illustrate examples of steps in the fabrication of the optical element stack assembly of FIG. 1.
Figure 2B:
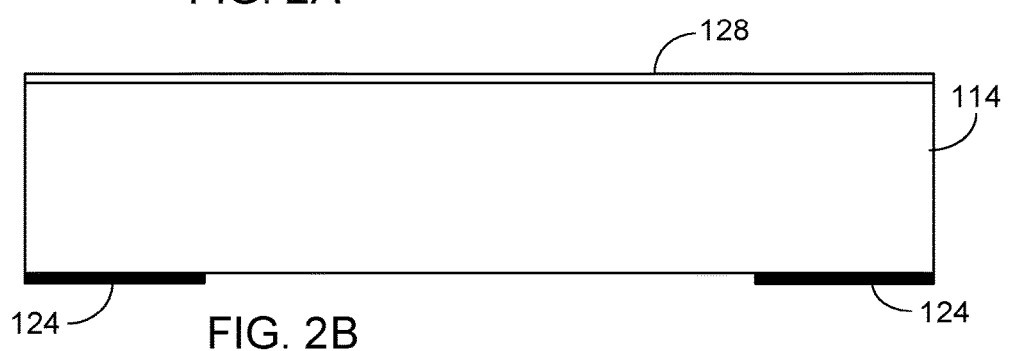

As shown in FIG. 2A, a first transparent wafer 114 is provided and has an ARC 128 on a first surface and a non-transparent layer (e.g., photoresist) 123 on its opposite second surface. The wafer 114 can be composed, for example of a glass, polymer or other material that is transparent to the specified wavelength or range of wavelengths. As shown in FIG. 2B, the layer 123 is patterned (e.g., using standard photolithography techniques) to form regions 124 of non-transparent material that define the non-transparent coating 24 for each assembly 10.

Figure 2C:
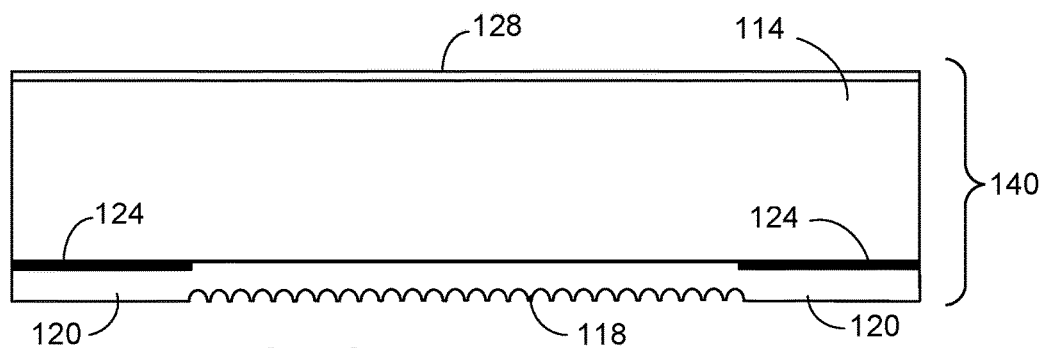

Next, as shown in FIG. 2C, optical elements 118 (e.g., DOEs) are formed on the second surface of the substrate 114. The optical elements 118, one of which is shown in FIG. 1C, can be formed, for example, by wafer-level replication. In general, replication refers to a technique by means of which a given tool (the tool including e.g., a negative of the optical elements) structure or a negative positive thereof is used to reproduced via, e.g., etching, embossing or molding a structured surface (e.g., a positive of the optical elements). In a particular example of a replication process, a structured surface (e.g., defining an optical element or a plurality of optical elements) is pressed into a liquid, viscous or plastically deformable material by using a tool, then the material is hardened, e.g., by curing using ultraviolet radiation and/or heating, and then the structured surface tool is removed. Thus, a replica of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state. The thickness of the yard portions 120 of the replicated material typically is 50 µm or less (e.g., 25-50 µm). The processing in FIGS. 2A-2C results in a first wafer subassembly 140 that provides the top substrate 14 for each assembly 10.

Figure 2D:
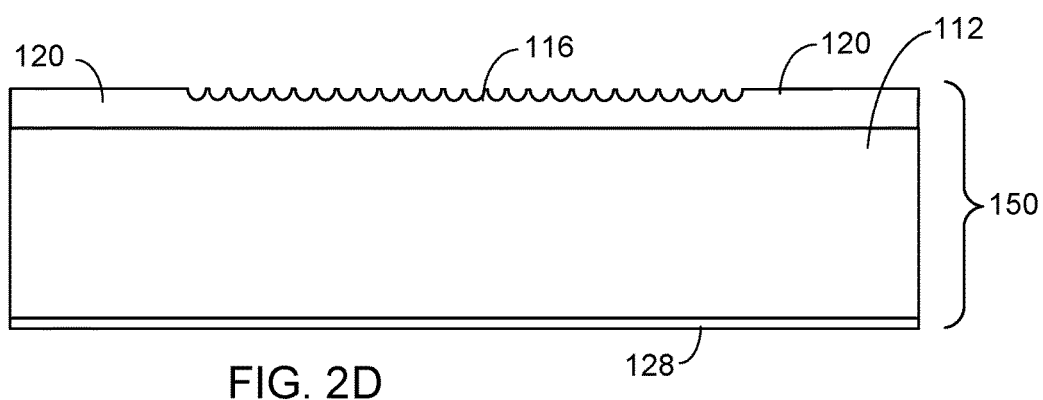

As part of the fabrication process, a second transparent wafer 112 is provided and has an ARC 128 on its first surface. Optical elements 116 (e.g., DOEs), one of which is shown in FIG. 2D, are formed on the second surface of the wafer 112. The optical elements 116 also can be formed, for example, by wafer-level replication as described above. The processing in FIG. 2D results in a second wafer subassembly 150 that provides the bottom substrate 12 for each assembly 10.

Figure 2E:
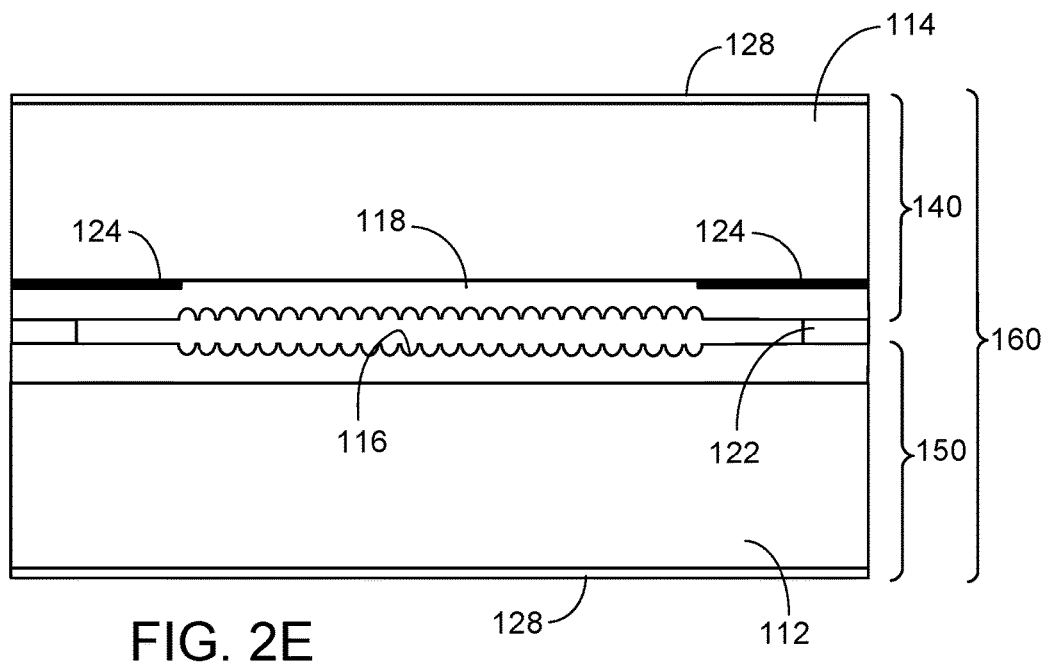
Figure 2F:
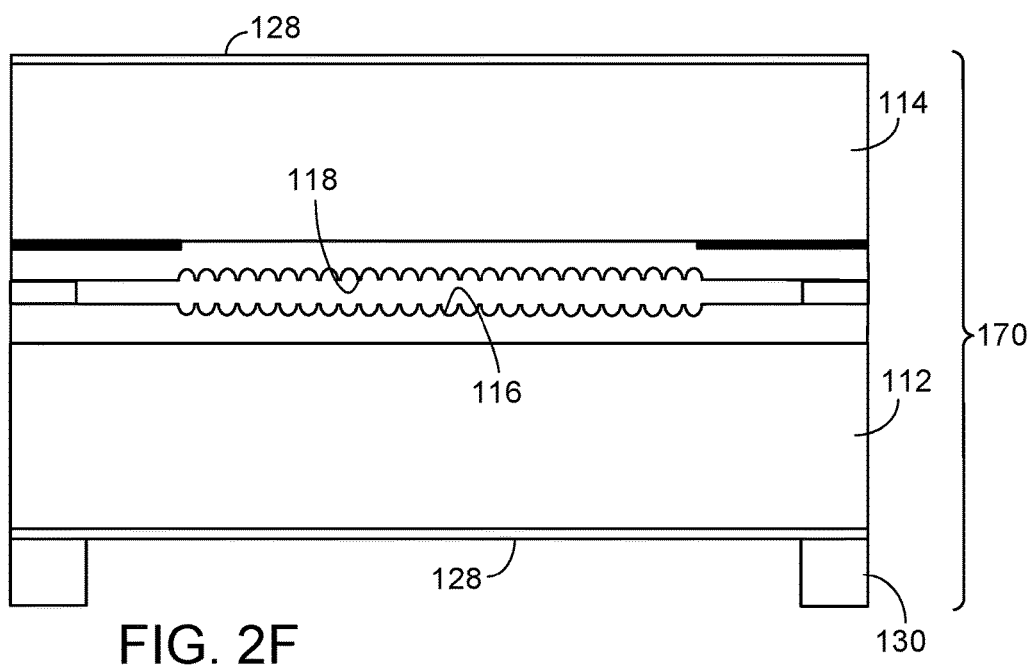

Next, as shown in FIG. 2E, the first and second wafer subassemblies 140, 150 are attached to one another to form a wafer sub-stack 160. The subassemblies 140, 150 can be attached to one another, for example, by glue or other adhesive 122 (e.g., by glue setting or screen printing). The subassemblies 140, 150 can be attached to one another such that the optical elements 116, 118 face one another. Further, as shown in FIG. 2F, a spacer wafer 130 is attached to the ARC-side of the second wafer assembly 150 to complete the wafer stack 170. The spacer wafer 130 can be attached, for example, by glue or other adhesive. Once the wafer-level stack 170 is completed, it can be separated (e.g., by dicing) to form multiple individual assemblies 10.

In the example process of FIGS. 2A-2F, both wafers 112, 114 have optical elements 116, 118 replicated on their respective surfaces. In some implementations, however, only one of the wafers (either the first wafer 114 or the second wafer 112) has optical elements on its surface. Further, although the optical elements 116, 118 are shown as DOEs, other types of optical elements can be used in some instances.

Figure 3:
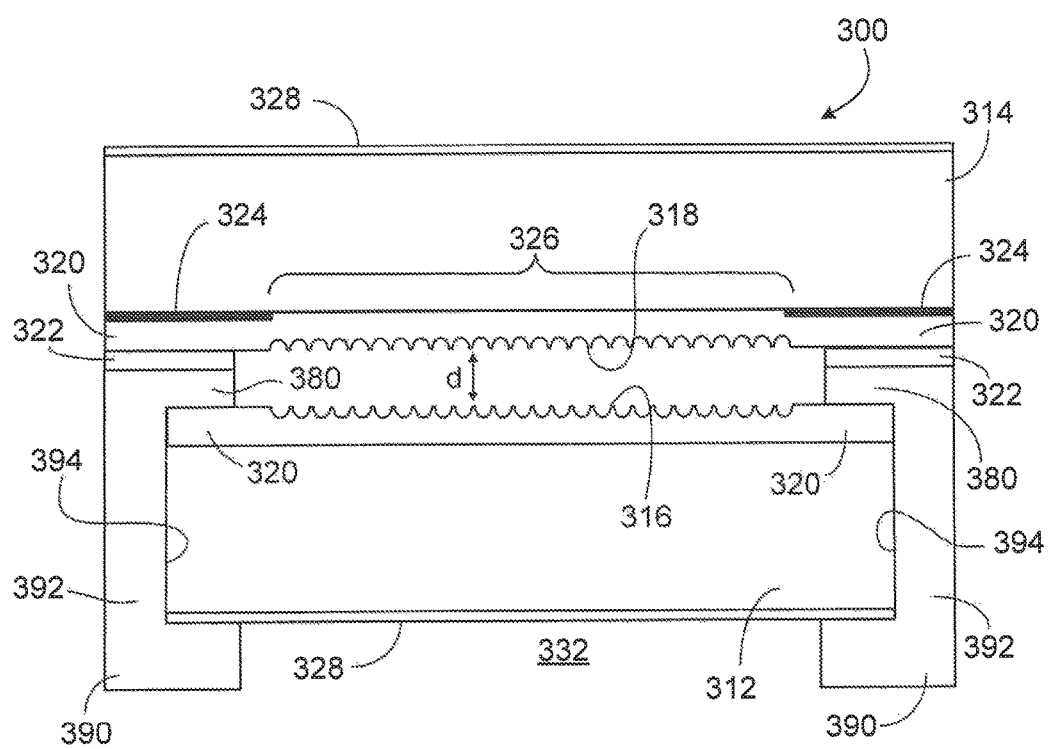
FIG. 3 illustrates a second example of an optical element stack assembly.

FIG. 3 illustrates a second example of an optical element stack assembly 300. The stack assembly 300 includes first and second substrates 312, 314 stacked one over the other. Each substrate 312, 314 can be composed, for example of a glass, polymer or other material that is transparent to a specified wavelength or range of wavelengths (e.g., in the visible, infra-red (IR) and/or near-IR parts of the spectrum).

In the example of FIG. 3, the substrates 312, 314 have passive optical elements 316, 318 formed on their opposing surfaces. In the illustrated example, the optical elements 316, 318 are DOEs. Other types of passive optical elements (e.g., refractive or diffractive lenses) can be provided in some implementations. Further, in some cases, one substrate 312 may have a type of optical element that differs from the type of optical element on the other substrate 314. In some instances, only one of the substrates 312, 314 may have an optical element on its surface.

A thin non-transparent coating 324 on the optical-element side of the top substrate 314 defines an optical stop 326, which serves as a transparent window through which light of the specified wavelength or in the specified range of wavelengths can pass. An outer surface of each substrate 312, 314 can be coated with a thin anti-reflective coating (ARC) 328.

To increase the separation 'd' between the opposing optical elements 16, 18, a vacuum injection molded spacer 380 separates the lateral side portions 320 of the material forming the optical elements 316, 318. The spacer 380 can be fixed directly (without adhesive) to the lateral side portion 320 of the optical element 316 on the bottom substrate 312. The spacer 380 can be attached to the lateral side portion 320 of the optical element 318 on the top substrate 314 by glue or other adhesive 322. The ARC-side of the bottom substrate 312 includes a spacer 390 to provide a well-defined distance between the optical elements 316, 318 and a surface on which the assembly 300 is mounted. The spacer 390 can be a vacuum injection molded spacer, which can be fixed directly to the ARC-side of the bottom substrate 312 (i.e., without adhesive). The spacer 390 has an opening 332 below the stop 326.

As illustrated in FIG. 3, the spacers 380 and 390 can be formed as a single vacuum injection molded piece, part 392 of which surrounds the lateral side edges 394 of the bottom substrate 312.

Figure 4A:
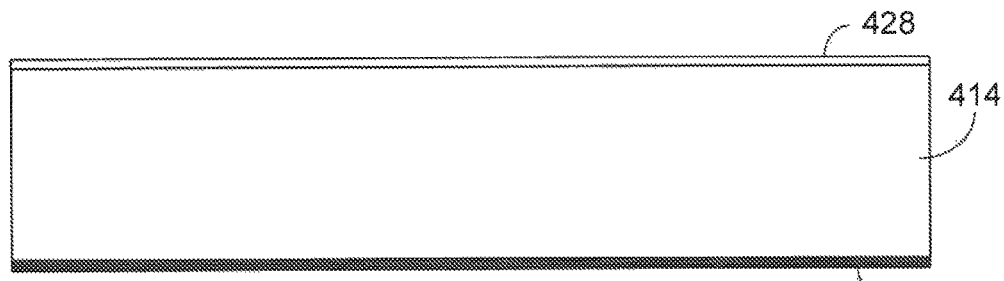
FIGS. 4A-4F illustrate examples of steps in the fabrication of the optical element stack assembly of FIG. 3.
Figure 4B:
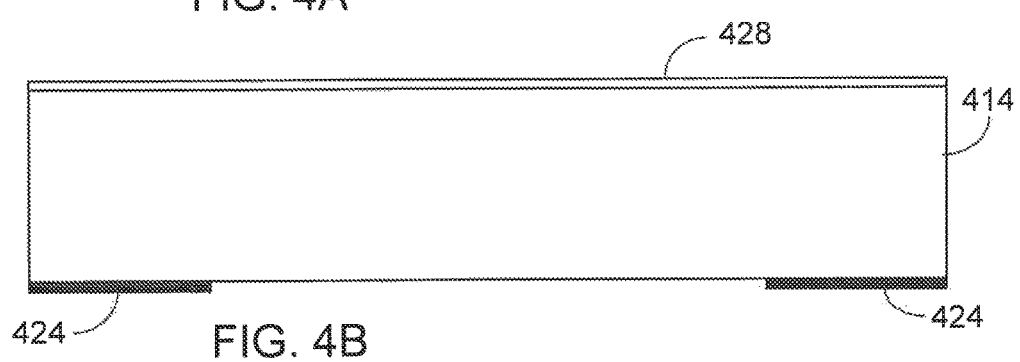
Figure 4C:
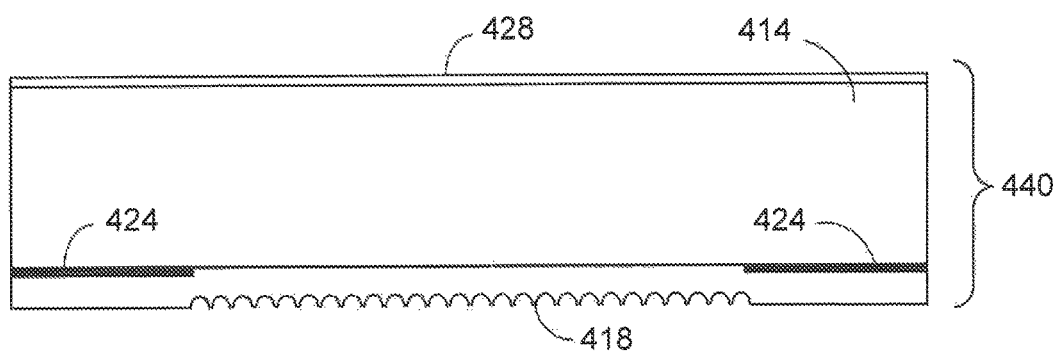

FIGS. 4A-4F illustrate steps of a wafer-level method for manufacturing optical element stack assemblies such as the assembly 300 of FIG. 3. FIGS. 4A-4C show a process for forming a first wafer subassembly 440 that provides the top substrate 314 for each assembly 300. This part of the process can be substantially the same as the corresponding steps in FIGS. 2A-2C. Thus, as shown in FIG. 4A, a first transparent wafer 414 is provided and has an ARC 428 on a first surface and a non-transparent layer (e.g., photoresist) 423 on its opposite second surface. The wafer 414 can be composed, for example of a glass, polymer or other material that is transparent to the specified wavelength or range of wavelengths. As shown in FIG. 4B, the layer 423 is patterned (e.g., using standard photolithography techniques) to form regions 424 of non-transparent material that define the non-transparent coating 324 for each assembly 300.

Next, as shown in FIG. 4C, optical elements 418 (e.g., DOEs) are formed on the second surface of the substrate 414. The optical elements 418, one of which is shown in FIG. 4C, can be formed, for example, by wafer-level replication, as discussed above. The processing in FIGS. 4A-4C results in a first wafer subassembly 440 that provides the top substrate 314 for each assembly 300.

Figure 4D:
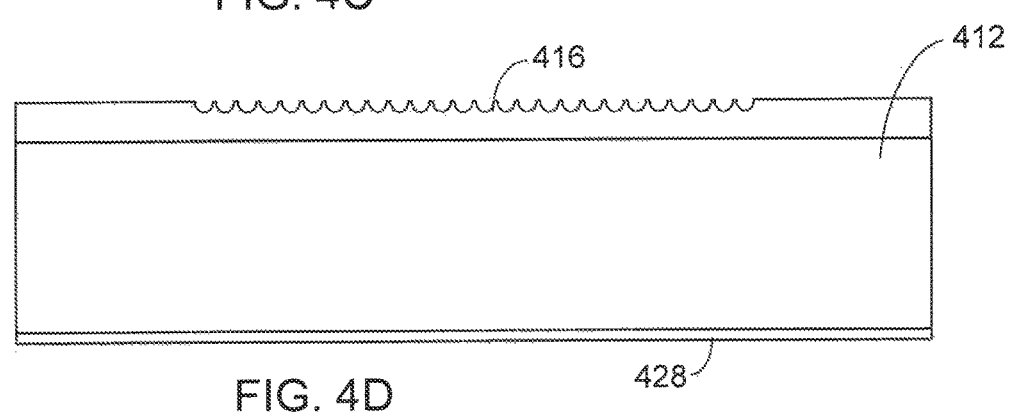

As part of the fabrication process, a second transparent wafer 412 also is provided and has an ARC 428 on its first surface (FIG. 4D). Initial preparation and processing of the second wafer 412 can be similar to that of wafer 112 in FIG. 2D. Thus, optical elements 416 (e.g., DOEs), one of which is shown in FIG. 4D, are formed on the second surface of the wafer 412. The optical elements 416 also can be formed, for example, by wafer-level replication as described above.

Figure 4E:
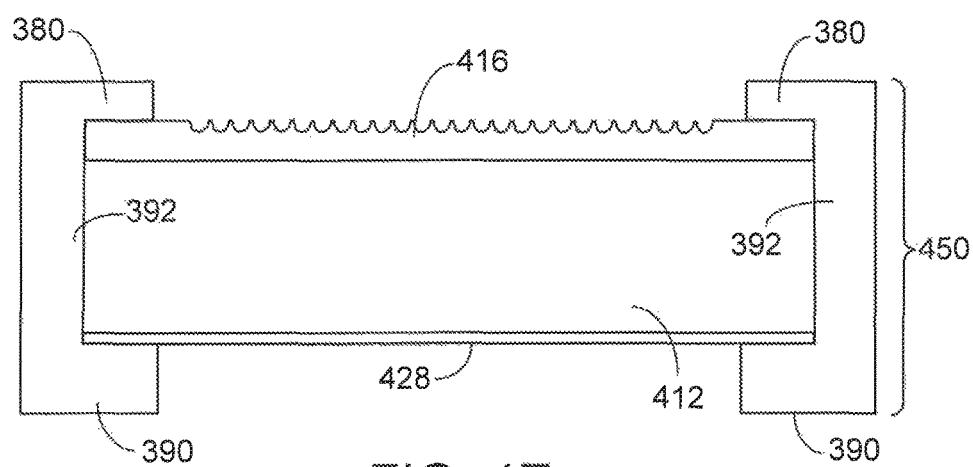

Next, as illustrated in FIG. 4E, second wafer subassembly 450 is subject to formation of through-holes and a vacuum injection molding process that fills the through-holes and forms the top and bottom spacers 380, 390. Thus, the spacers 380, 390 can be formed as a single vacuum injection molded piece, part 392 of which fills though-holes in the second wafer 412. Suitable techniques are described in U.S. Pat. No. 9,094,593 and in U.S. Published Patent Application No. 2015-0034975. The techniques include forming through-holes through a wafer, for example, by dicing, micromachining or laser cutting. Vacuum injection then can be used to provide an epoxy or other suitable material to fill the openings in the wafer and form the spacers. In some cases, the epoxy or other material subsequently is cured (e.g., via exposure to heat and/or UV treatments). The disclosures of the aforementioned US patent documents are incorporated herein by reference. The processing in FIG. 4E results in a second wafer subassembly 450 that provides the bottom substrate 412 for each assembly 300.

Figure 4F:
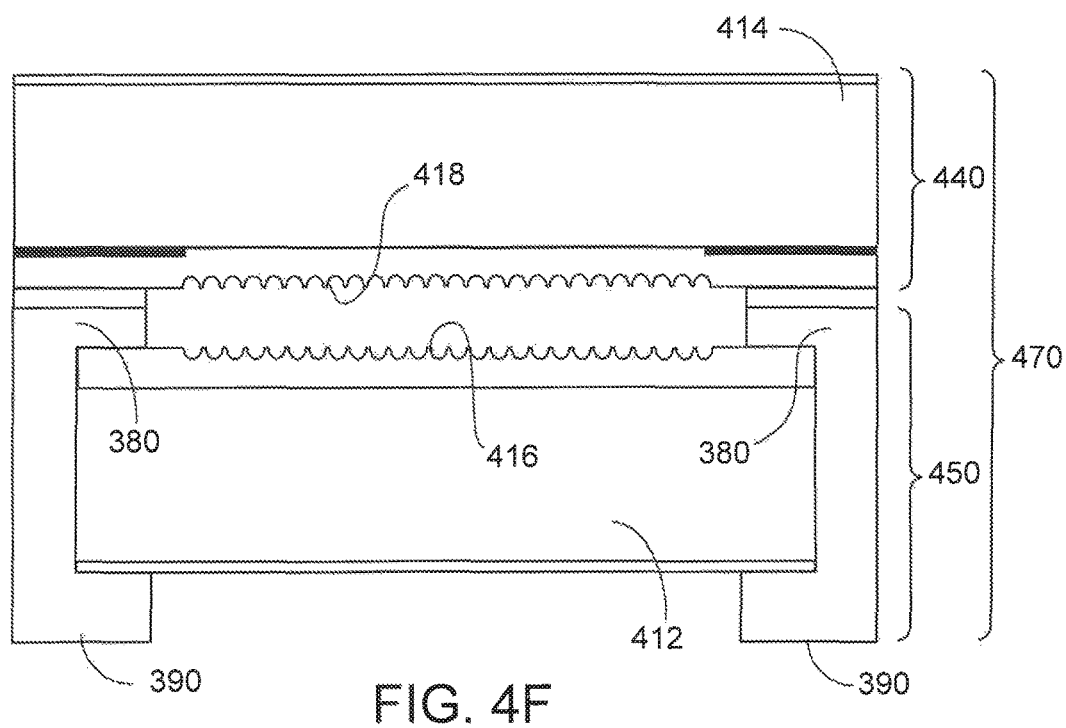

Next, as shown in FIG. 4F, the first and second wafer subassemblies 440, 450 are attached to one another to form a wafer stack 470. The subassemblies 440, 450 can be attached to one another, for example, by glue or other adhesive (e.g., by glue jetting or screen printing), and can be attached to one another such that the optical elements 416, 418 face one another. The wafer-level stack 470 then can be separated (e.g., by dicing) to form multiple individual assemblies 300.

In some instances, in FIG. 4E, the second wafer subassembly 450 can be attached, for example, to UV dicing tape and then diced to form multiple singulated substrates. The singulated substrates then can be provided to a vacuum injection tool to form the upper and lower spacers 380, 390. In that case, the wafer-level method can include attaching the first wafer 414 to the singulated substrates to form a stack such that each optical element 416, 418 is disposed between the first wafer 414 and one of the singulated substrates. The stack then is separated (e.g., by dicing) into a plurality of stack assemblies, each of which includes at least one of the optical elements.

Using a vacuum injection technique to form the spacers 380, 390 can be advantageous. For example, the addition of the upper spacer 380 allows the distance 'd' between the optical elements 316, 318 to be increased even if the thickness of the lateral side portions 320 of the replicated material for the optical elements 316, 318 is somewhat limited (e.g., limited to 50 µm or less in some cases).

In the example process of FIGS. 4A-4F, both wafers 412, 414 have optical elements 416, 418 replicated on their respective surfaces. In some implementations, however, only one of the wafers (either the first wafer 414 or the second wafer 412) has optical elements on its surface. Further, although the optical elements 416, 418 are shown as DOEs, other types of optical elements can be used in some instances.

The stack assemblies 10 (FIG. 1) and 300 (FIG. 3) can be integrated into, and used with, a wide range of optoelectronic modules. Such modules may include active optoelectronic components such as light emitters (e.g., light emitting diodes (LEDs), infra-red (IR) LEDs, organic LEDs (OLEDs), infra-red (IR) lasers or vertical cavity surface emitting lasers (VCSELs)) and/or light sensors (e.g., CCD or CMOS sensor). Further, such modules can be integrated into various types of consumer electronics and other devices such as mobile phones, smart phones, personal digital assistants (PDAs), tablets and laptops, as well as bio devices, mobile robots, and digital cameras, among others.

Various modifications will be readily apparent and are within the spirit of the invention. Thus, other implementations are within the scope of the claims.

What is claimed is:

1. A wafer-level method of fabricating a plurality of stack assemblies, the method comprising:
providing first and second wafers, wherein each of the first wafer and the second wafer has a plurality of optical elements on its surface;
forming through-holes in the second wafer;
using a single vacuum injection technique to form vacuum injection molded pieces which each include an upper and a lower spacer on opposite surfaces of the second wafer, and a part which fills a through-hole in the second wafer with a same material that forms the upper and lower spacers;
attaching the first wafer to the second wafer to form a wafer stack, the first and second wafers being attached such that each optical element is disposed between the first and second wafers, wherein the first and second wafers are attached to one another through adhesive disposed between lateral side portions of the optical elements of the first wafer and the optical elements on the second wafer; and
separating the wafer stack into a plurality of stack assemblies, each of which includes at least two of the optical elements.

2. The method of claim 1 wherein the optical elements are diffractive optical elements.

3. The method of claim 1 wherein the optical elements are replicated optical elements.

* * * * *